United States Patent
Faber et al.

(10) Patent No.: US 10,134,563 B2
(45) Date of Patent: Nov. 20, 2018

(54) CONTACTLESS TEMPERATURE MEASUREMENT IN A CHARGED PARTICLE MICROSCOPE

(71) Applicant: FEI Company, Hillsboro, OR (US)

(72) Inventors: Jacob Simon Faber, Eindhoven (NL); Lubomir Tuma, Brno (CZ); Timothy Burnett, Manchester (GB); Libor Novak, Brno (CZ)

(73) Assignee: FEI Company, Hillsboro, OR (US)

( * ) Notice: Subject to any disclaimer, the term of this patent is extended or adjusted under 35 U.S.C. 154(b) by 334 days.

(21) Appl. No.: 14/939,218

(22) Filed: Nov. 12, 2015

(65) Prior Publication Data
US 2016/0133436 A1    May 12, 2016

(30) Foreign Application Priority Data
Nov. 12, 2014    (EP) .................................... 14192853

(51) Int. Cl.
*G01K 1/08*    (2006.01)
*H01J 37/26*    (2006.01)
(Continued)

(52) U.S. Cl.
CPC ............ *H01J 37/261* (2013.01); *G01K 11/30* (2013.01); *H01J 37/20* (2013.01); *H01J 37/244* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 8,395,127 B1* | 3/2013 | Frach | G01T 1/2018 |
| | | | 250/370.08 |
| 2008/0164414 A1* | 7/2008 | Stellari | G01J 3/443 |
| | | | 250/347 |

(Continued)

FOREIGN PATENT DOCUMENTS

| | | |
|---|---|---|
| EP | 2009705 | 12/2008 |
| JP | 2007327766 | 12/2007 |
| JP | 2007333585 | 12/2007 |

OTHER PUBLICATIONS

"Correlative Analysis in the TEM and SEM Kirkendall Effect Zinc Oxide/Alumina Spinel Formation Observed in Situ", Application Note, Aduro, Accessed Nov. 10, 2015.*
(Continued)

*Primary Examiner* — Manish S Shah
*Assistant Examiner* — Nasir U Ahmed
(74) *Attorney, Agent, or Firm* — Scheinberg & Associates, P.C.; Michael O. Scheinberg

(57) ABSTRACT

Disclosed is a method of using a charged particle microscope for inspecting a sample mounted on a sample holder. The microscope is equipped with a solid state detector for detecting secondary particles emanating from the sample in response to irradiation of the sample with the primary beam, with the solid state detector in direct optical view of the sample. In some embodiments, the sample is mounted on a heater with a fast thermal response time. The method comprises contactless measurement of the temperature of the sample and/or sample holder using the solid state detector.

20 Claims, 2 Drawing Sheets

(51) Int. Cl.
 *G01K 11/30* (2006.01)
 *H01J 37/20* (2006.01)
 *H01J 37/244* (2006.01)

(52) U.S. Cl.
 CPC ............... *H01J 2237/2001* (2013.01); *H01J 2237/2065* (2013.01); *H01J 2237/28* (2013.01)

(56) References Cited

U.S. PATENT DOCUMENTS

| | | |
|---|---|---|
| 2008/0290290 A1 | 11/2008 | Nagakubo et al. |
| 2010/0108882 A1 | 5/2010 | Zewail |
| 2012/0292505 A1* | 11/2012 | Damiano ............... H01J 37/20 250/307 |
| 2013/0340127 A1 | 12/2013 | Wu et al. |

OTHER PUBLICATIONS

"Correlative Analysis in the TEM and SEM Kirkendall Effect Zinc Oxide/Alumina Spinel Formation Observed in Situ", Application Note, Aduro, Accessed Nov. 10, 2015, 1 page. <http://website.protochips.netdna-cdn.com/images/stories/aa01.2.pdf>.

* cited by examiner

CONTACTLESS TEMPERATURE MEASUREMENT IN A CHARGED PARTICLE MICROSCOPE

FIELD OF THE INVENTION

The invention relates to a method of using a charged particle microscope, the charged particle microscope equipped for inspecting a sample mounted on a sample holder with a primary beam of charged particles, the charged particle microscope equipped with a solid state detector (SSD) for detecting secondary particles emanating from the sample in response to irradiation of the sample with the primary beam, the solid state detector in direct optical view of the sample, the charged particle microscope equipped with means to heat the sample.

The invention further relates to an apparatus for performing said method.

BACKGROUND OF THE INVENTION

Such a method is known from the Application Note 'Aduro™ AA01.2' [-1-] from Protochips, Raleigh, N.C. 27606, USA.

The application note describes the heating of a sample (zinc oxide/alumina layers) on a MEMS heater (E-chip) in a SEM (Hitachi SU-6600 SEM). The heating is to a temperature in excess of 700° C. (appr. 1000 K).

When studying for example the phase transition of materials (metals) heating the sample is needed. The Aduro E-chip is a sample holder replacing the standard TEM grid. The E-chip comprises a monolithic ceramic membrane with a build-in heater. It can be heated to a temperature of over 1000° C. (appr. 1300 K).

The E-chip can be mounted in a special SEM stage, where it is contacted with electrical contacts. As an alternative is can be mounted in a side-entry holder for a TEM, so that heating experiments can be performed in a TEM.

It is unknown if the Hitachi SEM has a SSD in optical view of the heater. However, this is known from a similar use described in 'High Temperature SEM Demo' [-2-], where the Aduro heating stage is used in situ in a Nova NanoSEM 230 manufactured by FEI Company, Hillsboro, USA. This SEM comprises an in-lens BackScattered Electron Detector (BSED), the in-lens BSED a Solid State Detector in optical view of the sample.

Related to heating often also quenching is needed, that is: the rapid cooling of a sample to 'freeze' a condition of the sample.

The time in which the E-chip heats up or cools down is very small, in the order of a millisecond. Heating and cooling rates are more than $10^4$ K/s when the E-chip is heated to approximately 1000 K in an environment at room temperature.

It is noted that the heating and cooling rate at temperature dependent as the amount of radiation emitted is strongly temperature dependent: $P \approx T^4$.

The heater of the E-chip is an Ohmic heater and the temperature of the E-chip is determined by measuring the resistance of the Ohmic heater.

The invention intends to provide an alternative method for measuring the temperature of a sample holder with a heater having a fast response time. More specifically it is an object of the invention to provide an alternative method to measure the temperature of the sample, and an alternative method to measure transients in temperature.

SUMMARY OF THE INVENTION

To that end the invention is characterized in that the method comprises contactless measurement of the temperature of the sample and/or sample holder using the solid state detector (SSD) when the sample is not irradiated by the primary beam.

The invention is based on the insight that a solid state detector as used in an electron microscope is not only sensitive to secondary radiation from the group of secondary electrons, backscattered electrons and X-rays, but is also sensitive to photons in the range of visible light and/or infrared. Therefore exposure to thermal radiation, normally only seen as interfering with the detection of SE's, BSEs and X-rays, can be used advantageously to measure the temperature of sample or sample holder. As the method is contactless, the method does not influence the thermal characteristics of the sample and/or sample holder (heat capacity, maximum temperature, etc.), nor is there a chance of, for example, diffusion of the materials used for the measurement into the sample or vice versa.

In an embodiment the heater is a MEMS heater.

This embodiment describes the use of the method in combination with a MEMS heater such as the Aduro E-chip.

In another embodiment the heating is a contactless heating caused by a laser, microwave heating or by induction or electron beam heating.

In this embodiment both heating and measuring are contactless. This gives optimum freedom for the choice of the supporting structure, as no materials are added thereto as an Ohmic heater.

It is noted that when using electron beam heating the electron beam may be the beam used inspection, but that more likely a dedicated beam for heating is used.

When using a laser, the laser can be used to illuminate the holder from the side opposite to the side seen by the SSD, so that the radiation of the laser does not influence the temperature read-out (assuming the support structure is non-transparent to the laser radiation).

It is noted that the choice of the color and the polarization of the laser may be critical for reaching a desired temperature.

It is noted that the primary beam may be a primary beam of electrons or a primary beam of ions (positively or negatively charged atoms, molecules or clusters).

Preferably the thermal response time of the heater is less than 10 ms, more specifically less than 1 ms.

When using a thin film as sample support, a low heat capacity and thus a quick thermal response can be realized.

Preferably the temperature of the sample holder and/or sample can be adjusted to exceed 1000 K, more specifically 1300 K.

By choosing a suitable material, such as carbon, ceramics (silicon nitride, silicon boron) etc. a sample holder with these temperatures can be realized. Important is that the material of the holder itself does not evaporate at the elevated temperature, and does not deteriorate the vacuum (typically between 1 hPa to $10^{-6}$ hPa), and that the holder material and the sample material do not react/diffuse at these elevated temperature.

Preferably the heating and cooling rate is—at a sample temperature of 1000 K and an environment at room temperature—in excess of $10^4$ K/s, more specifically in excess of $10^5$ K/s.

Many experiments for, for example, metals research, ask for fast quenching of the sample.

In another embodiment the method further comprises detection of changes of heating or cooling rate due to changes of heat capacity.

This enables the use of the method for microcalorimetry.

It is noted that the change in heat capacity may be caused by a phase change (endothermic or exothermic) of the sample.

In an aspect of the invention a charged particle microscope equipped for inspecting a sample mounted on a sample holder with a primary beam of charged particles, the charged particle microscope equipped with a solid state detector for detecting secondary particles emanating from the sample in response to irradiation of the sample with the primary beam, the solid state detector in direct optical view of the sample, the signal of the solid state detector in working fed to a processor, the processor equipped to display an image on a display unit, the charged particle microscope equipped with a heater controller for controlling the temperature of a heater, is characterized in that the processor is equipped to operate in at least two modes, a first mode where the processor displays a signal proportional to the intensity of electrons emanating from the sample and a second mode where the processor displays the temperature of the sample using the signal of the detector without the sample being irradiated by the beam.

In an embodiment of the charged particle microscope the charged particle microscope is equipped to blank the primary beam when determining the temperature.

Preferably the charged particle microscope is capable of heating the sample to a temperature of at least 1000 K, more specifically to a temperature of at least 1300 K.

In an embodiment the charged particle microscope is equipped with a contactless heater for heating the sample holder and/or the sample, the contactless heater from the group of lasers, microwave heaters, induction heaters and electron beam heaters.

In another embodiment the charged particle microscope is a microscope from the group of microscopes comprising a Transmission Electron Microscope column, a Scanning Transmission Electron Microscope column, a Scanning Electron Microscope column, a Focused Ion Beam column, or a combination thereof.

Preferably the charged particle microscope is equipped with a SSD with a response time for detecting temperature changes of less than 10 ms, more specifically less than 1 ms.

BRIEF DESCRIPTION OF THE DRAWINGS

The invention will now be elucidated in more detail on the basis of exemplary embodiments and the accompanying schematic drawings, in which.

DETAILED DESCRIPTION OF THE DRAWINGS

Figure 1A:
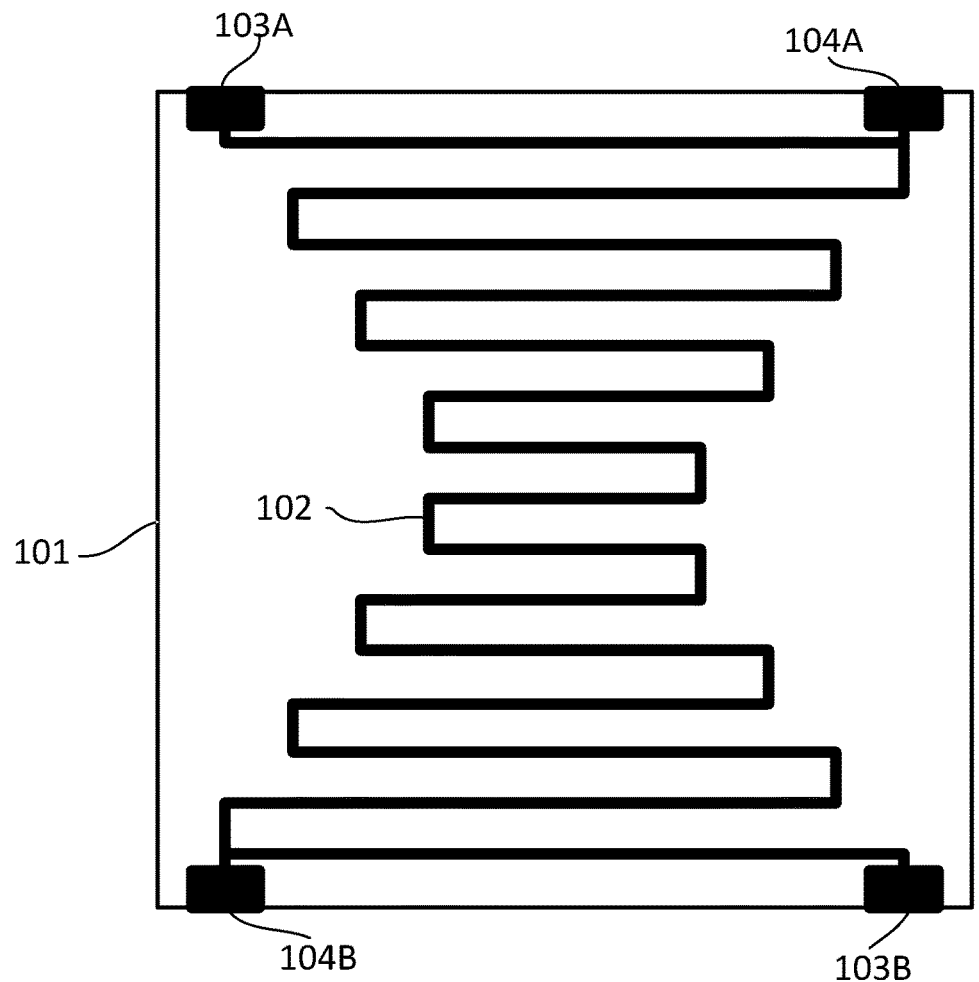
FIG. 1A schematically shows a MEMS heater as seen from the bottom.

FIG. 1a schematically shows a MEMS heater as seen from the bottom, that is: the side removed from the side where charged particles impact on the MEMS heater.

A piece of thermally resistant, electrically insulating material, such as a ceramic part 101 is covered with a metallic track 102 forming a resistive heater. To heat the track (and thus the ceramic part 101) a current is applied over pads 103A, 103B. A 4-point resistivity measurement can be made by measuring the voltage over pads 104A, 104B.

The ceramic material can be a silicon comprising material, or for example a boron comprising material. Examples are SiN, $SiO_2$, BN, or a sandwich of SiN and $SiO_2$.

Metals from the group of refractory metals (for example W, Mo, Ta, Cr, or Ti) are used as heater material for metallic track 102. The heater can be on the surface of the ceramic part, or embedded in the ceramic part (the ceramic part being for example a sandwich). Other materials from which the track may be formed are for example carbon or a semiconductive track, provided that the material is sufficiently temperature resistant and has appropriate electric properties for heating. The form of the metal track can be tuned to give an even distribution of the heat, or a spot on the ceramic with high temperature compared to its surroundings. The temperature can be measured by measuring a part of the resistance of the metal track, or by measuring the resistance of a separate, dedicated track. Such a dedicated track need not be a track of a single metal, but may be a track comprising, for example, a thermocouple.

It is noted that the heated part of the ceramic part is preferably a thin film, so that little heat is conducted from this part to the microscope, where is can cause unwanted effects such as drift or damage to electronic parts such as detectors. Also the size (surface area) of the heated part should be small for said reasons.

Figure 1B:
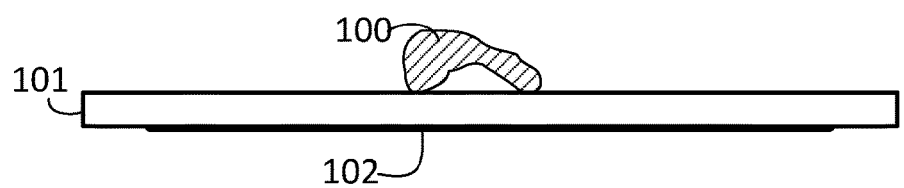
FIG. 1B schematically shows a side view of the MEMS heater shown in FIG. 1A.

FIG. 1B schematically shows a side view of the MEMS heater shown in FIG. 1A.

FIG. 1B shows the ceramic part 101 with the track 102 at one side and a sample 100 at the opposite side. Placing the sample and the heater at opposite sides avoids diffusion of sample material in the metal track or vice versa. The sample makes contact with the MEMS heater at a few points only. This will typically be the case prior to heating. After heating, the sample may wet the ceramic or it may repel the ceramic (in the latter case again contacting the ceramic at a small surface only). Heating of the sample takes place mostly through indirect heating, that is: by radiation emerging from the ceramic. Cooling takes place by radiation as well. Conduction through the relatively thin ceramic part is hardly of importance.

As cooling takes place by radiation, the cooling rate is strongly dependent on the temperature: at high temperatures the cooling rate is higher than at lower temperatures.

Figure 2:
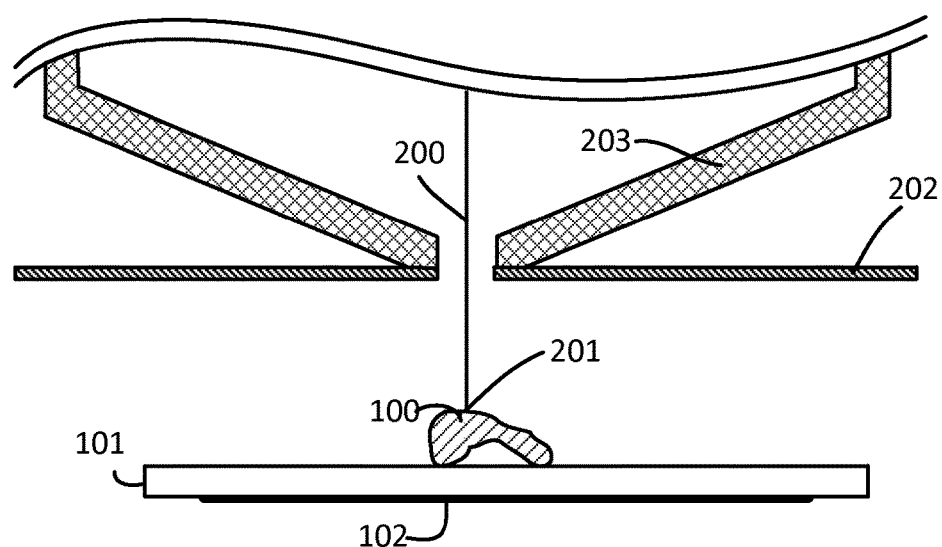
FIG. 2 schematically shows a SSD positioned above said MEMS heater.

FIG. 2 schematically shows a SSD positioned above said MEMS heater

FIG. 2 can be thought to be derived from FIG. 1B. Additionally to FIG. 1B a beam of particulate radiation 200 is shown, impacting on the sample 100 at location 201.

From this impact location secondary radiation is emitted and detected by SSD 202 that is mounted on a pole piece 203 of a magnetic lens.

The beam of particulate radiation can be a beam of electrons, for example a beam of electrons with a selectable energy of between 200 eV and 30 keV as often used in a SEM, or a beam with a selectable energy of between 40 and 300 keV, as often used in a STEM. Other energies are known to be used. The beam of particulate radiation may also be a beam of ions (positive or negative charged atoms, molecules, or clusters) with a selectable energy of, for example, between 500 eV and 40 keV, as customary used in a FIB.

In all the above mentioned cases secondary radiation in the form of secondary electrons (SEs) are emitted. In the case of incoming electrons also backscattered electrons (BSEs) are formed, as well as X-rays. The SEs, BSEs and X-rays can be detected by the SSD, the SSD of a type as described in, for example, European Patent Application Publication No. EP2009705.

The detector is equipped with a central hole for passing the primary beam of radiation. Said beam (and thus the impact site 201) is scanned over the surface of the sample 100.

Figure 3:
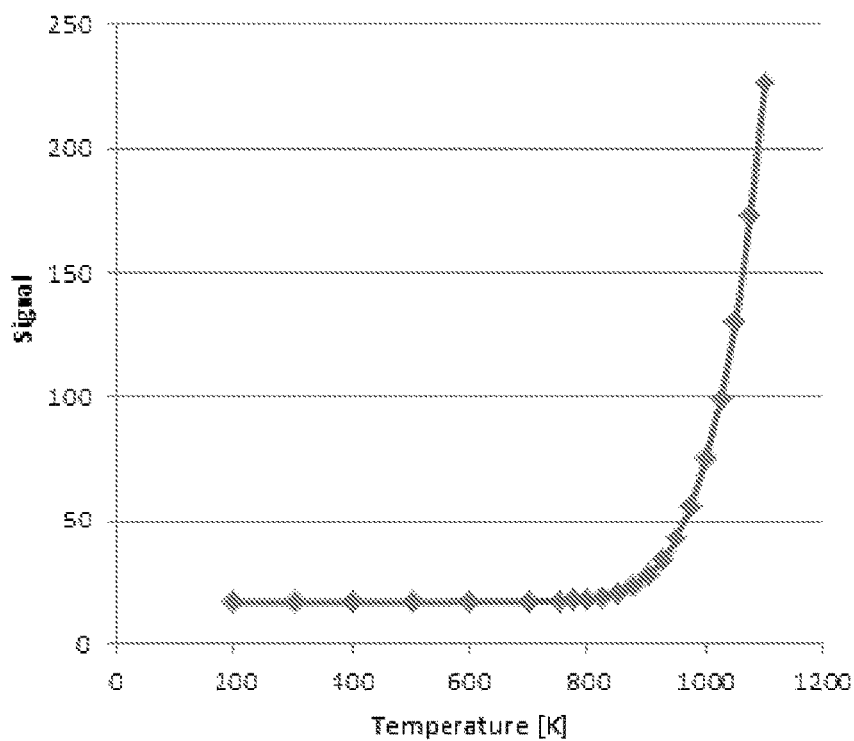
FIG. 3 schematically shows the signal of a SSD versus the temperature of a sample.

FIG. 3 schematically shows the signal of a SSD as a function of the temperature of a sample.

FIG. 3 shows a signal-versus-temperature plot, in which the maximum signal is close to 255 (one byte) and the minimum signal close to zero. Other scalings can be used, for example a two-byte scaling from 0 to $(2^{16}-1)$, or a scaling from 0 to 100%. As known to the skilled person these levels can be adjusted by a first control often known as the brightness control, black level or offset and a second control often known as the gain or contrast of the processor processing the signal.

The SSD is not sensitive for long wave length, and as a consequence no or very little change in signal occurs for a temperature of 800 K or less. For a temperature in excess of approximately 800 K, more specifically in excess of 1000 K, the signal of the detector is sufficiently dependent on the temperature to use it for measuring the temperature.

It is noted that before use a temperature versus signal plot for the SSD signal needs to be determined. This can be a factory setting, or can be determined prior to an experiment with a sample on the heater (empty heater). The temperature of the (empty) MEMS heater itself can be a factory calibration, or a calibration using a four point measurement of Ohmic resistance, or another type of temperature dependent measurement of the metal track. The temperature dependency of the SSD can also be based on a comparison of the signal of the SSD with prior determined temperature curves. Each of these methods has its pros and cons. It is mentioned that the size of the hot area may vary with the volume of the sample, the 'blackness' of the sample (that is: in how far is the emitted radiation black body radiation) etc., resulting in changes in temperature versus signal plots.

Although FIG. 3 can be interpreted such that for temperatures above 1150 K clipping of the detector signal occurs, this is not the case: using a lower gain the detector signal can be kept below its maximum value.

CITED NON-PATENT LITERATURE

[-1-] Application Note Aduro™ AA01.2; http://website.protochips.netdna-cdn.com/images/stories/aa01.2.pdf
[-2-] High-Temperature SEM DEMO; http://www.mse.ucla.edu/events/events-archive/2013/high-temperature-sem-demo

The invention claimed is:

1. A method of using a charged particle microscope, the charged particle microscope equipped for inspecting a sample mounted on a sample holder with a primary beam of charged particles, the charged particle microscope equipped with a solid state detector capable of detecting secondary particles emitted from the sample in response to irradiation of the sample with the primary beam, capable of detecting photons that impinge on the solid state detector, and disposed in direct optical view of the sample, the method comprising:

heating the sample and/or the sample holder with a heater having a fast thermal response time; and performing contactless measurement of the temperature of the sample and/or the sample holder, while the sample is not being irradiated by the primary beam, by detecting photons emitted from sample that impinge on the solid state detector.

2. The method of claim 1, in which the heater is a MEMS heater and the sample is disposed on the MEMS heater.

3. The method of claim 1, in which heating the sample comprises causing contactless heating of the sample and/or the sample holder using a laser, microwave heating, induction or electron beam heating.

4. The method of claim 1, wherein:

the primary beam of charged particles is a primary beam of electrons or a primary beam of ions; and the solid state detector is sensitive to photons having wavelengths in the range of visible light, infrared light, or a combination thereof.

5. The method of claim 1, in which the thermal response time of the heater is less than 10 ms.

6. The method of claim 1, in which the temperature of the heater can be adjusted to exceed 1000 K.

7. The method of claim 6, wherein:

heating the sample and/or the sample holder comprises heating the sample and/or the sample holder to a temperature in excess of 1000 K, and a heating rate and a cooling rate of the sample and/or the sample holder is in excess of $10^4$ K/s while the sample and/or the sample holder is at the temperature in excess of 1000 K.

8. The method of claim 1, further comprising detecting a change in a heating rate or a cooling rate of the sample and/or the sample holder due to a change in the heat capacity of the sample and/or the sample holder.

9. The method of claim 8, in which the change in heat capacity is caused by a phase change of the sample.

10. The method of claim 1, further comprising blanking the primary beam while performing the contactless measurement of the temperature.

11. A charged particle microscope equipped for inspecting a sample mounted on a sample holder with a primary beam of charged particles, comprising:

a solid state detector capable of detecting secondary particles emitted from the sample in response to irradiation of the sample with the primary beam, capable of detecting photons that impinge on the solid state detector, disposed in direct optical view of the sample, and configured to feed a signal corresponding to radiation emissions detected by the solid state detector to a processor equipped to display an image on a display unit; and a heater controller for controlling the temperature of a heater, wherein the solid state detector is configured to:

detect secondary electrons emitted from the sample while the primary beam irradiates the sample and output a first signal proportional to the intensity of the secondary electrons detected; and detect photons emitted from the sample while the primary beam does not irradiate the sample and output a second signal corresponding to the detected photons, and wherein the processor is configured to determine the temperature of the sample in response to the second signal.

12. The charged particle microscope of claim 11, in which the charged particle microscope is programmed to blank the primary beam of charged particles when determining a temperature.

13. The charged particle microscope of claim 11, capable of heating the sample to a temperature of greater than or equal to 1000 K.

14. The charged particle microscope of claim 13, in which the heater comprises a contactless heater, the contactless heater selected from the group consisting of lasers, microwave heaters, induction heaters and electron beam heaters.

15. The charged particle microscope of claim 11, equipped with a contactless heater for heating the sample and/or the sample holder, the contactless heater selected from the group consisting of lasers, microwave heaters, induction heaters and electron beam heaters.

16. The charged particle microscope of claim 11, in which the charged particle microscope is a charged particle microscope selected from the group consisting of a Transmission Electron Microscopes column, a Scanning Transmission Electron Microscope column, a Scanning Electron Microscope column, a Focused Ion Beam column, and any combination thereof.

17. The charged particle microscope of claim 11, in which the thermal response time of the solid state detector is less than 10 ms.

18. A method of measuring the temperature of a sample in a charged particle microscope using a solid state detector capable of detecting electrons and photons that impinge on the solid state detector, comprising:
   mounting a sample on a sample stage, the sample stage comprising a heater with a fast thermal response;
   irradiating the sample with a charged particle beam,
   detecting radiation emitted from the sample using the solid state detector while the sample is being irradiated by the charged particle beam;
   ceasing irradiation of the sample with the charged particle beam;
   detecting photons emitted from the sample after ceasing irradiation of the sample with the charged particle beam; and
   determining the temperature of the sample from a signal of the solid state detector generated as a result of detecting photons emitted from the sample.

19. The method of claim 18, wherein the photons emitted by the sample while the sample is not being irradiated by the charged particle beam is visible or infrared radiation.

20. The method of claim 18, further comprising determining a rate of change of the temperature of the sample.

* * * * *